United States Patent
McRae

(10) Patent No.: US 9,110,331 B2
(45) Date of Patent: Aug. 18, 2015

(54) ULTRA-THIN BACKLIGHT FOR LCD DISPLAYS THROUGH USE OF FIELD-INDUCED POLYMER ELECTRO LUMINESCENCE PANELS INCLUDING INTEGRATED LIGHT GUIDE

(71) Applicant: Vizio Inc., Irvine, CA (US)

(72) Inventor: Matthew McRae, Irvine, CA (US)

(73) Assignee: Vizio, Inc., Irvine, CA (US)

( * ) Notice: Subject to any disclaimer, the term of this patent is extended or adjusted under 35 U.S.C. 154(b) by 336 days.

(21) Appl. No.: 13/800,064

(22) Filed: Mar. 13, 2013

(65) Prior Publication Data
US 2014/0267938 A1 Sep. 18, 2014

(51) Int. Cl.
| | | |
|---|---|---|
| G02F 1/1335 | (2006.01) | |
| G09F 13/04 | (2006.01) | |
| H01L 51/50 | (2006.01) | |
| H01L 27/32 | (2006.01) | |
| B82Y 20/00 | (2011.01) | |
| F21V 8/00 | (2006.01) | |

(52) U.S. Cl.
CPC ............ *G02F 1/133606* (2013.01); *B82Y 20/00* (2013.01); *G02B 6/0001* (2013.01); *G02B 6/0036* (2013.01); *G02B 6/0043* (2013.01); *G02F 1/133603* (2013.01); *G09F 13/04* (2013.01); *H01L 27/32* (2013.01); *H01L 51/50* (2013.01); *G02F 1/133605* (2013.01); *G02F 2001/133612* (2013.01); *G02F 2202/022* (2013.01); *G02F 2202/36* (2013.01)

(58) Field of Classification Search
CPC ............ G02F 1/133606; G02B 6/0036; G02B 6/0043
See application file for complete search history.

(56) References Cited

U.S. PATENT DOCUMENTS

| | | |
|---|---|---|
| 5,480,582 A | 1/1996 | Pope |
| 5,757,124 A | 5/1998 | Pope |
| 6,079,838 A | 6/2000 | Parker et al. |
| 6,160,596 A | 12/2000 | Sylvester et al. |
| 6,218,774 B1 | 4/2001 | Pope |
| 6,749,312 B2 | 6/2004 | Parker et al. |
| 6,752,505 B2 | 6/2004 | Parker et al. |
| 6,755,547 B2 | 6/2004 | Parker |
| 7,090,389 B2 | 8/2006 | Parker et al. |
| 7,160,015 B2 | 1/2007 | Parker |
| 7,165,873 B2 | 1/2007 | Parker |
| 7,178,965 B2 | 2/2007 | Parker |
| 7,195,389 B2 | 3/2007 | Parker et al. |
| 7,226,196 B2 | 6/2007 | Parker et al. |
| 7,300,194 B2 | 11/2007 | Parker |
| 7,322,730 B2 | 1/2008 | Parker |
| 7,354,184 B2 | 4/2008 | Parker |

(Continued)

OTHER PUBLICATIONS

Effect of multi-walled carbon nanotubes on electron injection and charge generation in AC field-induced polymer electroluminescence Yonghua Chen, Gregory M. Smith, Eamon Loughman, Yuan Li, Wanyi Ni, David L. Carroll.

*Primary Examiner* — David V Bruce

(57) ABSTRACT

A display system, having an emissive body, emitting light over a complete surface as part of a display system. The emissive body can be a FIPEL type device with a first transparent conductive coating over a light emitting substrate. A transparent substrate, has first and second surfaces, with the first surface coupled to the first transparent conductive coating, and the second surface of the transparent substrate including a surface formed with plural light channeling structures thereon.

25 Claims, 3 Drawing Sheets

(56) References Cited

U.S. PATENT DOCUMENTS

| | | |
|---|---|---|
| 7,364,341 B2 | 4/2008 | Parker et al. |
| 7,364,342 B2 | 4/2008 | Parker et al. |
| 7,374,305 B2 | 5/2008 | Parker |
| 7,384,177 B2 | 6/2008 | Parker |
| 7,404,660 B2 | 7/2008 | Parker |
| 7,404,661 B2 | 7/2008 | Parker et al. |
| 7,434,973 B2 | 10/2008 | Parker et al. |
| 7,434,974 B2 | 10/2008 | Parker |
| 7,467,887 B2 | 12/2008 | Parker |
| 7,524,101 B2 | 4/2009 | Parker |
| 7,537,370 B2 | 5/2009 | Parker |
| 7,563,012 B2 | 7/2009 | Parker |
| 7,703,967 B2 | 4/2010 | Parker |
| 7,736,043 B2 | 6/2010 | Parker |
| 7,780,329 B2 | 8/2010 | McCollum et al. |
| 7,798,695 B2 | 9/2010 | Parker |
| 2014/0361281 A1* | 12/2014 | Carroll .......................... 257/40 |

* cited by examiner

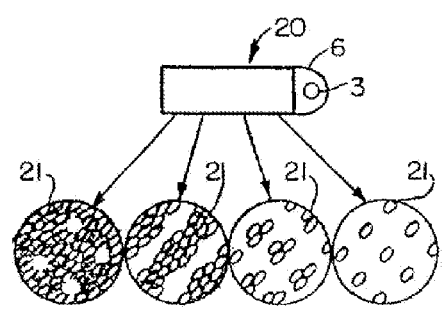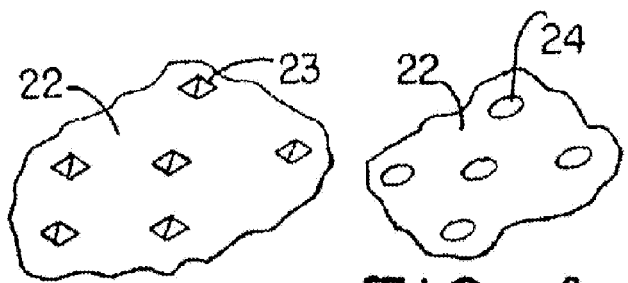
FIG.4a  FIG.4b  FIG.4c
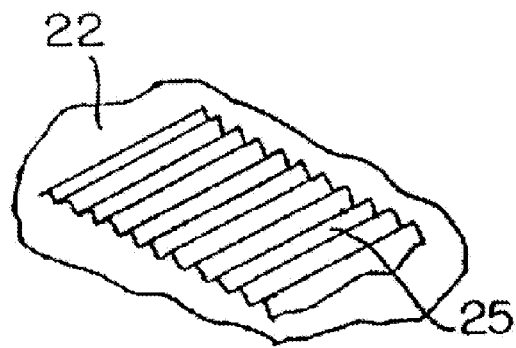
FIG.4d

ULTRA-THIN BACKLIGHT FOR LCD DISPLAYS THROUGH USE OF FIELD-INDUCED POLYMER ELECTRO LUMINESCENCE PANELS INCLUDING INTEGRATED LIGHT GUIDE

BACKGROUND

Current backlight systems such as edge lit LED panels contain many individual components. Edge lit panels contain multiple LED light sources, a thick plastic like light guide or light pipe, reflective devices such as tape that resides on the edges of the light guide to reduce the amount light lost, back reflectors or films and sheets that have micro prisms and/or micro lens molded into the surfaces to redirect light out the front of the panel (see prior art FIGS. 4a, 4b, 4c and 4d). A diffusor sheet generally sits in front of the light guide panel to soften and mix the light from the light guide to eliminate any banding of the emitted light. The assembly may further have another sheet or file with more micro prisms and/or micro lens to help steer the light in a known direction to the diffusor to improve the efficiency of the emitted light from the light guide. Between the individual panel, sheets and films, there are often air gaps to allow the light to mix into more of a homogenous beam before entering the next sheet or film.

SUMMARY

A simpler apparatus, methods and systems are needed to produce a back lighting device that is less expensive, has a substantially lower parts count, is thinner, lighter in weight and is more power efficient than current LED edge lit or direct LED back lighting devices and systems.

The present invention is an apparatus and method for replacing LED edge lit and direct LED backlight panels for LCD displays. These displays are used for televisions, desktop and laptop computer displays, tablet computers, appliance and consumer electronics devices, PDAs, mobile devices such as cell phones and wired and wireless telephones, PDAs, instrument displays for vehicles and various test equipment devices, large commercial displays such as stadium displays, add on lightings such as television back directed lighting and bezel lighting and other various lighting through back lighted display panels.

BRIEF DESCRIPTION OF THE DRAWINGS

Prior Art FIG. 4A is a depiction of a light guide panel with micro-lens impressed or molded into or onto at least one surface of the panel to steer the emitted light.

Prior Art FIG. 4B is a depiction of a light guide surface with micro-prisms impressed or molded into or onto at least one surface of the panel to steer the emitted light Prior Art FIG. 4c is another depiction of a light guide panel with micro-lens impressed or molded into or onto at least one surface of the panel to steer the emitted light.

Prior Art FIG. 4D is another depiction of a light guide panel with elongated rows of prisms impressed or molded into or onto at least one surface of the panel to steer the emitted light.

DETAILED DESCRIPTION

The present invention is based on Field-Induced Polymer Electro-Luminescence (FIPEL) technology. FIPEL was developed as an area lighting device that produces larger quantities of light for a given size panel than previous electroluminescence (EL) panels which are well known in the art. FIPEL panels operate on alternating current. The frequency of the current is higher than 60 or 50 Hz normally used to power EL panels.

Figure 1:
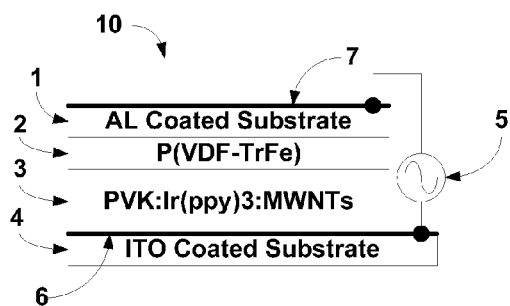
FIG. 1 is a depiction of an asymmetrical (single dielectric layer) FIPEL light emitting device which emits light only from its front surface 4.
Figure 3:
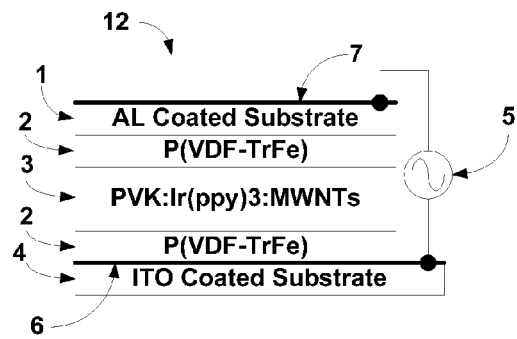
FIG. 3 is a depiction of a symmetrical (dual dielectric layers) FIPEL light emitting device which emits light only from its front surface 4

FIPEL panels are simple and inexpensive to construct. Typical configurations for FIPEL panels are shown in FIGS. 1 and 3. Note the differences between the two panels.

Typical Device Construction

Figure 2:
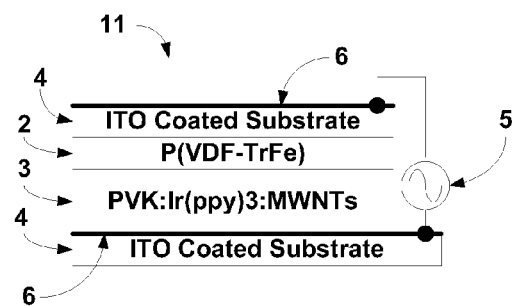
FIG. 2 is a depiction of an asymmetrical (single dielectric layer) FIPEL light emitting device which emits light from its front and back surfaces 4.
Figure 4:
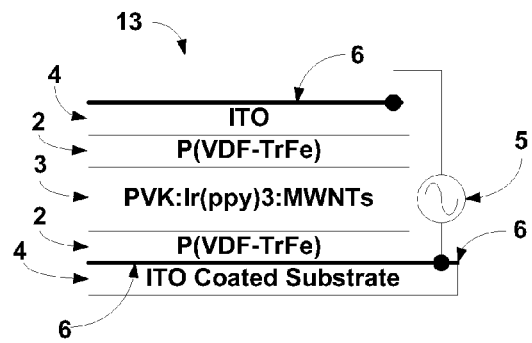
FIG. 4 is a depiction of an asymmetrical symmetrical (dual dielectric layers) FIPEL light emitting device which emits light from its front and back surfaces 4.

FIGS. 1 and 2 illustrate single dielectric (layer 2 through) FIPEL devices and FIGS. 3 and 4 illustrate dual dielectric (layers 2 through) FIPEL devices. Another ordering of groups is single surface emission (FIGS. 1 and 4) and dual surface emissions (FIGS. 2 and 4). The differences between these two groups deal with the direction of emitted light. The basic construction of FIPEL devices is discussed in the following.

Lab quality FIPEL devices are generally fabricated on glass substrates with various coatings such as aluminum and Indium tin oxide (ITO). ITO is a widely used transparent conducting oxide because of its two chief properties, its electrical conductivity and optical transparency, as well as the ease with which it can be deposited as a thin film. Because of this, ITO is used for conducting traces on the substrates of most LCD display screens. As with all transparent conducting films, a compromise must be made between conductivity and transparency, since increasing the thickness and increasing the concentration of charge carriers will increase the material's conductivity, but decrease its transparency. The ITO coating used for the lab devices discussed here is approximately 100 nm. In the figures the ITO coated glass substrates are identified by the reference numbers 4/6 throughout. More generally, however, any conductive transparent coating can be used.

The other substrate (1) has aluminum 7 (Al) deposited on a glass substrate 1. The resulting thickness of the Al deposition is sufficient to be optically opaque. The AL deposit on the glass substrate 1/7 acts as an electrode and reflector to ensure light from emissive layer 3 is directed through ITO substrate layer 4/6 for devices illustrated in FIGS. 1 and 3.

Each device includes a dielectric layer(s) 2. For the lab devices dielectric layer 2 is deposed on the opposite side of top substrate layer 1/7 (FIGS. 1 and 3) or substrate layer 4/6 (FIGS. 2 and 4).

Dielectric layer 2 is composed of a copolymer of P(VDF-TrFE) (51/49%). The dielectric layer is generally spin coated against the glass side of the top layer (insulated side) and the ITO (conductive) side of the bottom glass substrate.

Emissive layer 3 is composed of a mix polymer base of poly (N-vinylcarbazole):fac-tris(2-phenylpyri-dine)iridium (III) [PVK:Ir(ppy)3] with Multi Walled Nano Tubes (MWNT). The emissive layer coating is laid onto the dielectric layer to a depth of approximately 200 nm. For the lab devices with the greatest light output the concentration of MWNTs to the polymer mix is approximately 0.04% by weight.

When an alternating current is applied across the devices shown in FIGS. 1 and 2 (asymmetrical devices) and 3 and 4 (symmetrical devices), the emissive layer 3 emits light at specific wavelengths depending on the frequency of the alternating current. The alternating current is applied across the conductive side of the top layer 1/7 (FIGS. 1 and 3) and the conductive side of the bottom layer 4/6 FIG. 3 or bottom and top layers 4/6 (FIGS. 2 and 4). Light emission comes from the injection of electrons and holes into the emissive layer. Holes follow the PVK paths in the mixed emissive polymer and electrons follow the MWNTs paths. Signal generator 5 may be fixed, as to the frequency it provides to a FIPEL device or it may be control by a computer where the frequency is determined based on algorithms and data contained within content that will be displayed.

Carriers within the emissive layer then recombine to form excitons, which are a bound state of an electron and hole that are attracted to each other by the electrostatic force or field in the PVK host polymer, and are subsequently transferred to the Ir(ppy)3 guest, leading to the light emission.

Figure 5:
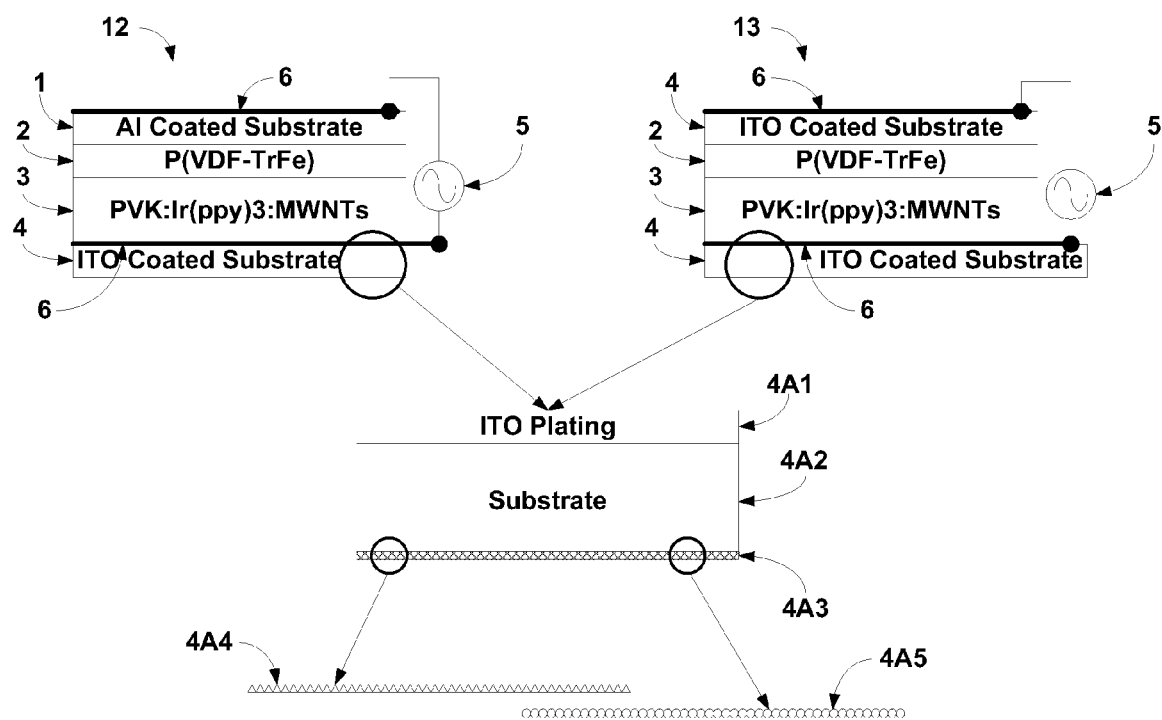
FIG. 5 depicts a magnified view of the bottom substrate 4A (4) in FIGS. 1 and 2.

The present invention enhances basic FIPEL devices. FIG. 5 depicts one possible embodiment of the present invention.

Note that in FIGS. 1 and 2 reference 4/6 relates to the bottom ITO Plated Substrate in FIGS. 1-4. Reference number 4A1, 4A2 and 4A3 in FIG. 5 show an enlarged version of the ITO plated substrate 4/6. In the enlarged depiction of FIG. 5, the ITO layer is shown as ITO Plating4A1. The ITO material may be deposited onto substrate 4A2 by any number of means such as plating, sputtering, vapor deposition, spin coated or any other means. Substrate 4A2 may be glass or some other suitable material such as poly(ethylene terephthalate) (PET) or other suitable optically transparent material.

Note that the bottom of the substrate layer 4A3 can be an irregular surface. Structures 4A4 and 4A5 depict two possible surfaces from a large plurality of surfaces. 4A4 depicts a row of micro prisms that extend across the bottom surface of substrate 4A2. Structure 4A5 is an alternative embodiment that depicts rows of micro lenses. Either of these structures will cover the bottom surface of substrate 4A2. These structures will steer or redirect the light being emitted through substrate layer 4A2. The present structures 4A4 and 4A5 are depicted as being molded into the bottom surface of substrate 4A2. These structures could just as easily be formed or molded such that they project out from the bottom surface of substrate 4A2 or a combination of projecting into the bottom surface of 4A2 and out from the bottom surface of 4A2. Also note that the two structures shown are only exemplary and not the only possible structures. Any other structures that have optical parts that can channel light can be used in this way. The light can be channeled by these structures to a spatial light modulator that can form pixels in different colors. The spatial light modulator can be an LCD, e.g., a TFT, VA, IPS, IGZO family of LCDs.

The present invention enhances the light efficiency of FIPEL and electro-luminous devices and gives the device the ability to beam form and focus light leaving the surface of the device which is not possible with the currently available smooth surfaced FIPEL and electro-luminous devices.

Note that this light focusing/beaming structure can be created on both sides of the device, attached to both ITO substrates 4A and 4B of FIG. 5 or 4/6 of FIGS. 2 and 4 to create light coming from both sides of the device.

These embodiments can also be used with the new Samsung display screen technology called Electro-wetting Displays which may have backlights or have only have reflective back surfaces that reflect ambient light. A FIPEL panel of the type shown in the embodiments in FIGS. 1 and 3 can provide both. When the FIPEL panel is active with this type of display, the display would be using a backlight. When the FIPEL panel is turned off, the reflective back surface of the FIPEL panel is reflective. This gives the Electro-wetting Display the best of both worlds.

Although only a few embodiments have been disclosed in detail above, other embodiments are possible and the inventors intend these to be encompassed within this specification. The specification describes specific examples to accomplish a more general goal that may be accomplished in another way. This disclosure is intended to be exemplary, and the claims are intended to cover any modification or alternatives which might be predictable to a person having ordinary skill in the art. For example, other sizes and thicknesses can be used.

Those of skill in the art would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality, for example signal generator 5 and associated control circuits such as microprocessors and System On Chip (SOC) devices. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary embodiments.

The various illustrative logical blocks, modules, and circuits described in connection with the embodiments disclosed herein, may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. The processor can be part of a computer system that also has a user interface port that communicates with a user interface, and which receives commands entered by a user, has at least one memory (e.g., hard drive or other comparable storage, and random access memory) that stores electronic information including a program that operates under control of the processor and with communication via the user interface port, and a video output that produces its output via any kind of video output format, e.g., VGA, DVI, HDMI, display port, or any other form. This may include laptop or desktop computers, and may also include portable computers, including cell phones, tablets such as the IPAD™, and all other kinds of computers and computing platforms.

A processor may also be implemented as a combination of computing devices, e.g., a combination of a DSP and a microprocessor, a plurality of microprocessors, one or more microprocessors in conjunction with a DSP core, or any other such configuration. These devices may also be used to select values for devices as described herein.

The steps of a method or algorithm described in connection with the embodiments disclosed herein may be embodied directly in hardware, in a software module executed by a processor, using cloud computing, or in combinations. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of tangible storage medium that stores tangible, non-transitory computer based instructions. An exemplary storage medium is coupled to the processor such that the processor can read information from, and write information to, the storage medium. In the alternative, the storage medium may be integral to the processor. The processor and the storage medium may reside in reconfigurable logic of any type.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer.

The memory storage can also be rotating magnetic hard disk drives, optical disk drives, or flash memory based storage drives or other such solid state, magnetic, or optical storage devices. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media. The computer readable media can be an article comprising a machine-readable non-transitory tangible medium embodying information indicative of instructions that when performed by one or more machines result in computer implemented operations comprising the actions described throughout this specification.

Operations as described herein can be carried out on or over a website. The website can be operated on a server computer, or operated locally, e.g., by being downloaded to the client computer, or operated via a server farm. The website can be accessed over a mobile phone or a PDA, or on any other client. The website can use HTML code in any form, e.g., MHTML, or XML, and via any form such as cascading style sheets ("CSS") or other.

Also, the inventor(s) intend that only those claims which use the words "means for" are intended to be interpreted under 35 USC 112, sixth paragraph. Moreover, no limitations from the specification are intended to be read into any claims, unless those limitations are expressly included in the claims. The computers described herein may be any kind of computer, either general purpose, or some specific purpose computer such as a workstation. The programs may be written in C, or Java, Brew or any other programming language. The programs may be resident on a storage medium, e.g., magnetic or optical, e.g. the computer hard drive, a removable disk or media such as a memory stick or SD media, or other removable medium. The programs may also be run over a network, for example, with a server or other machine sending signals to the local machine, which allows the local machine to carry out the operations described herein.

Where a specific numerical value is mentioned herein, it should be considered that the value may be increased or decreased by 20%, while still staying within the teachings of the present application, unless some different range is specifically mentioned. Where a specified logical sense is used, the opposite logical sense is also intended to be encompassed.

The previous description of the disclosed exemplary embodiments is provided to enable any person skilled in the art to make or use the present invention. Various modifications to these exemplary embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A display system, comprising
an emissive body, emitting light over a complete surface as part of a display system, said emissive body including a first transparent conductive coating over a light emitting substrate, and including a transparent substrate, having first and second surfaces, said first surface coupled to said first transparent conductive coating, and said second surface of said transparent substrate including a surface formed with plural light channeling structures thereon.

2. The display system as in claim 1, wherein said emissive body emits light from both front and back.

3. The display system as in claim 1, wherein said light channeling structures comprise an array of prisms.

4. The display system as in claim 1, wherein said light channeling structures comprise an array of micro-lenses.

5. The display system as in claim 1, further comprising a spatial light modulator, located to receive the light from said second surface of said transparent substrate.

6. The display system as in claim 5, wherein said spatial light modulator is liquid crystal, forming a liquid crystal display.

7. The display system as in claim 6, wherein the display system is a television.

8. This display system as in claim 6 wherein the display system is in a portable computer.

9. The display system as in claim 8, wherein said portable computer is one of a tablet, cell phone, or PDA.

10. The display system as in claim 6 wherein said spatial light modulator is composed of elements that are one of: TFT, VA, IPS, IGZO.

11. A method of forming light, comprising
emitting light over a complete surface as part of a display system, using a device with an emissive body including a first transparent conductive coating over a light emitting material having first and second surfaces; and
channeling the emitted light using a shaped surface on a transparent substrate attached to said first transparent coating, where the shaped surface includes plural light channeling structures thereon.

12. The method as in claim 11, wherein said emitting light comprises emitting light from both front and back of the surface.

13. The method as in claim 11, wherein said light channeling structures comprise an array of prisms.

14. The method as in claim 11, wherein said light channeling structures comprise an array of micro-lenses.

15. The method as in claim 11, further comprising creating a display using a spatial light modulator, located to receive the light from said second surface of said transparent substrate.

16. The method as in claim 15, wherein said spatial light modulator is liquid crystal, forming a liquid crystal display.

17. The method as in claim 15, wherein the display is in a television.

18. This method as in claim 15 wherein the display is in a portable computer.

19. The method as in claim 18, wherein said portable computer is one of a tablet, cell phone, or PDA.

20. The method as in claim 16 wherein said spatial light modulator is composed of elements that are one of: TFT, VA, IPS, IGZO.

21. A display system, comprising
an emissive body, emitting light over a complete surface as part of a display system, said emissive body including a light emitting material, a first transparent conductive coating over light emitting material, a transparent substrate, having a first surface attached to said first conductive coating and a second surface formed with plural light channeling structures thereon; and
a spatial light modulator, adjacent said emissive body and receiving light from said light channeling structures, over a surface of the spatial light modulator.

22. The display system as in claim 21, wherein said emissive body emits light from both front and back.

23. The display system as in claim 21, wherein said light channeling structures comprise an array of prisms.

24. The display system as in claim 21, wherein said light channeling structures comprise an array of micro-lenses.

25. The display system as in claim 21, wherein said spatial light modulator is a liquid crystal device.

\* \* \* \* \*